(12) United States Patent
Wang et al.

(10) Patent No.: US 10,536,568 B2
(45) Date of Patent: Jan. 14, 2020

(54) WATERPROOF FINGERPRINT RECOGNITION MODULE AND ELECTRONIC DEVICE

(71) Applicant: Huawei Technologies Co., Ltd., Shenzhen (CN)

(72) Inventors: Zhongjian Wang, Shenzhen (CN); Lifeng Fu, Shenzhen (CN); Jiwei Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/313,371

(22) PCT Filed: Jul. 1, 2016

(86) PCT No.: PCT/CN2016/088182
§ 371 (c)(1),
(2) Date: Dec. 26, 2018

(87) PCT Pub. No.: WO2018/000429
PCT Pub. Date: Jan. 4, 2018

(65) Prior Publication Data
US 2019/0166241 A1 May 30, 2019

(51) Int. Cl.
*G06K 9/00* (2006.01)
*H04M 1/18* (2006.01)
(Continued)

(52) U.S. Cl.
CPC ............ *H04M 1/18* (2013.01); *G06F 1/1656* (2013.01); *G06K 9/00053* (2013.01); *H01L 23/3135* (2013.01); *H04M 1/026* (2013.01)

(58) Field of Classification Search
CPC ....... H04M 1/18; H04M 1/026; G06F 1/1656; G06F 1/1626; G06F 1/1643;
(Continued)

(56) References Cited

U.S. PATENT DOCUMENTS

2002/0044675 A1* 4/2002 Chikazawa ........ G06K 9/00013
382/124
2009/0322627 A1* 12/2009 Sato ........................ G06F 1/162
343/702

(Continued)

FOREIGN PATENT DOCUMENTS

CN 102096815 A 6/2011
CN 202523077 U 11/2012
(Continued)

OTHER PUBLICATIONS

Foreign Communication From a Counterpart Application, European Application No. 16906828.5, Extended European Search Report dated Mar. 15, 2019, 9 pages.
(Continued)

*Primary Examiner* — Nathan S Taylor
(74) *Attorney, Agent, or Firm* — Conley Rose, P.C.

(57) ABSTRACT

An electronic device that includes a fingerprint recognition circuit and the fingerprint recognition circuit, where the fingerprint recognition circuit includes a protective cover, a fingerprint recognition sensor, a circuit connector, a wall plate, and a lower cover, where the protective cover is located on a top side of the wall plate, the wall plate encircles the fingerprint recognition sensor, the protective cover fully covers an upper opening of the wall plate, electronic waterproof adhesive is provided in a seam between the wall plate and the protective cover, the lower cover is located on a bottom side of the wall plate, the lower cover bonds with a lower part of the wall plate, and the circuit connector is electrically coupled to the fingerprint recognition sensor.

19 Claims, 6 Drawing Sheets

(51) Int. Cl.
*H04M 1/02* (2006.01)
*G06F 1/16* (2006.01)
*H01L 23/31* (2006.01)

(58) Field of Classification Search
CPC .... G06F 1/1684; G06K 9/00053; G06K 9/62; G06K 9/0002; G06K 9/00919; H01L 23/3135
USPC ...................................................... 455/575.8
See application file for complete search history.

(56) References Cited

U.S. PATENT DOCUMENTS

| | | |
|---|---|---|
| 2011/0309482 A1 | 12/2011 | Salatino et al. |
| 2013/0077215 A1* | 3/2013 | Tada ................ G06K 9/00006 361/679.01 |
| 2013/0176666 A1* | 7/2013 | Yamanaka ............ H05K 5/061 361/679.01 |
| 2013/0259329 A1 | 10/2013 | Wickboldt et al. |
| 2014/0231132 A1* | 8/2014 | Watanabe ............ H02G 15/013 174/650 |
| 2015/0014141 A1* | 1/2015 | Rao ...................... G06K 9/0002 200/600 |
| 2015/0201723 A1* | 7/2015 | Rayner ................. G06F 1/1601 224/191 |
| 2016/0033996 A1* | 2/2016 | Lee ...................... G06F 1/1626 361/679.26 |
| 2016/0171271 A1 | 6/2016 | Lundahl |
| 2016/0188695 A1* | 6/2016 | Lee .................... G06Q 10/0633 707/738 |
| 2017/0011210 A1* | 1/2017 | Cheong ................ A61B 5/0022 |
| 2017/0061193 A1* | 3/2017 | Young ................ G06K 9/00013 |
| 2017/0116455 A1* | 4/2017 | Alameh ................ G06F 1/3215 |
| 2017/0140195 A1 | 5/2017 | Wang et al. |
| 2017/0162620 A1 | 6/2017 | Wang et al. |
| 2017/0287797 A1 | 10/2017 | Wang et al. |
| 2019/0005292 A1* | 1/2019 | Pi ......................... G06F 1/1626 |
| 2019/0050623 A1* | 2/2019 | Lavin ................... G06K 9/0002 |

FOREIGN PATENT DOCUMENTS

| | | |
|---|---|---|
| CN | 104051366 A | 9/2014 |
| CN | 104051367 A | 9/2014 |
| CN | 104182737 A | 12/2014 |
| CN | 104201116 A | 12/2014 |
| CN | 204302997 U | 4/2015 |
| CN | 205302331 U | 6/2016 |
| EP | 1197911 A2 | 4/2002 |

OTHER PUBLICATIONS

Machine Translation and Abstract of Chinese Publication No. CN102096815, Jun. 15, 2011, 11 pages.
Machine Translation and Abstract of Chinese Publication No. CN104182737, Dec. 3, 2014, 16 pages.
Machine Translation and Abstract of Chinese Publication No. CN202523077, Nov. 7, 2012, 9 pages.
Machine Translation and Abstract of Chinese Publication No. CN204302997, Apr. 29, 2015, 7 pages.
Machine Translation and Abstract of Chinese Publication No. CN205302331, Jun. 8, 2016, 13 pages.
Foreign Communication From a Counterpart Application, PCT Application No. PCT/CN2016/088182, English Translation of International Search Report dated Mar. 27, 2017, 3 pages.
Foreign Communication From a Counterpart Application, PCT Application No. PCT/CN2016/088182, English Translation of Written Opinion dated Mar. 27, 2017, 3 pages.

* cited by examiner

WATERPROOF FINGERPRINT RECOGNITION MODULE AND ELECTRONIC DEVICE

CROSS-REFERENCE TO RELATED APPLICATIONS

This application is a U.S. National Stage of International Patent Application No. PCT/CN2016/088182 filed on Jul. 1, 2016, which is hereby incorporated by reference in its entirety.

TECHNICAL FIELD

The present invention relates to the field of electronic technologies, and in particular, to a waterproof fingerprint recognition module and an electronic device.

BACKGROUND

Currently, a fingerprint recognition function is more popular in a handheld electronic device such as a mobile phone or a tablet computer. With a fingerprint recognition module mounted on an electronic device, the electronic device can recognize a user's fingerprint, thereby improving security of the electronic device. However, because existing handheld electronic devices favor light and thin designs, a waterproof design for the fingerprint recognition module becomes a difficulty. As shown in FIG. 1, in the prior art, a groove (6) is opened on a housing of an electronic device, a fingerprint recognition module (5) is placed in the groove (6), and the groove (6) is stuffed with a waterproof adhesive layer, so that the entire fingerprint module of the electronic device is protected and isolated from other components of the electronic device. However, in this design solution, a structure of a mobile phone needs to be changed. If a size of the fingerprint module changes, the structure of the mobile phone needs to be designed again. Consequently, compatibility with mass production is lacking, a machining process is complex, adhesive needs to be dispensed on a plurality of positions, space for the fingerprint module is enlarged, and the mobile phone cannot be thin or light.

SUMMARY

Embodiments of the present invention provide a fingerprint recognition module, to achieve waterproofing in the fingerprint recognition module, improve compatibility with mass production, and reduce adhesive dispensing.

The fingerprint recognition module includes:
a protective cover (201), a fingerprint recognition sensor (202), a circuit connector (203), a wall plate (205), and a lower cover (206), where the protective cover (201) is located over the wall plate (205), the wall plate (205) encircles the fingerprint recognition sensor (202), the protective cover (201) fully covers an upper opening of the wall plate (205), electronic waterproof adhesive is provided in a seam between the wall plate (205) and the protective cover (201), the lower cover (206) is located under the wall plate (205), the lower cover (206) bonds with a lower part of the wall plate (205), and the circuit connector (203) is electrically connected to the fingerprint recognition sensor (202); where "over" refers to a direction that a fingerprint sensing surface of the fingerprint recognition sensor (202) faces, and "under" refers to a direction opposite to the direction that the fingerprint sensing surface of the fingerprint recognition sensor (202) faces.

Optionally, a groove (2051) is provided on an upper part of the wall plate (205), a boss (2011) is correspondingly provided on a lower part of the protective cover (201), and the boss (2011) fits the groove (2051).

Optionally, a notch (2052) is provided inside the upper opening of the wall plate (205), and a boss (2012) fitting the notch is provided on a lower part of the protective cover (201).

Optionally, a side opening (2053) is provided on a side face of the wall plate (205), the circuit connector (203) protrudes from the side opening (2053), and the side opening (2053) is stuffed with waterproof adhesive.

Optionally, a side opening (2053) is provided on a side face of the wall plate (205), the circuit connector (203) protrudes from the side opening (2053), the fingerprint recognition module further includes an elastomer (207), and the elastomer (207) tightly fits the side opening (2053).

According to another aspect of the present invention, an electronic device (700) is further provided, including a fingerprint recognition module and a printed circuit board (701), where the fingerprint recognition module includes:
a protective cover (201), a fingerprint recognition sensor (202), a circuit connector (203), a wall plate (205), and a lower cover (206), where the protective cover (201) is located over the wall plate (205), the wall plate (205) encircles the fingerprint recognition sensor (202), the protective cover (201) fully covers an upper opening of the wall plate (205), electronic waterproof adhesive is provided in a seam between the wall plate (205) and the protective cover (201), the lower cover (206) is located under the wall plate (205), the lower cover (206) bonds with a lower part of the wall plate (205), and the circuit connector (203) is electrically connected to the fingerprint recognition sensor (202) and the printed circuit board (701); where "over" refers to a direction that a fingerprint sensing surface of the fingerprint recognition sensor (202) faces, and "under" refers to a direction opposite to the direction that the fingerprint sensing surface of the fingerprint recognition sensor (202) faces.

Optionally, a groove (2051) is provided on an upper part of the wall plate (205), a boss (2011) is correspondingly provided on a lower part of the protective cover (201), and the boss (2011) fits the groove (2051).

Optionally, a notch (2052) is provided inside the upper opening of the wall plate (205), and a boss (2012) fitting the notch is provided on a lower part of the protective cover (201).

Optionally, a side opening (2053) is provided on a side face of the wall plate (205), the circuit connector (203) protrudes from the side opening (2053), and the side opening (2053) is stuffed with waterproof adhesive.

Optionally, a side opening (2053) is provided on a side face of the wall plate (205), the circuit connector (203) protrudes from the side opening (2053), the fingerprint recognition module further includes an elastomer (207), and the elastomer (207) tightly fits the side opening (2053).

According to the fingerprint recognition module and the electronic device that are provided in the foregoing embodiments, the fingerprint recognition sensor is encircled by the protective cover, the wall plate, and the lower cover, and electronic waterproof adhesive is provided in the seam, so that water is prevented from entering the fingerprint recognition sensor. In addition, the entire fingerprint module is integrated as a whole, so that waterproofing can be implemented by the fingerprint module, without a need to use a waterproofing design of another part of the electronic device to implement waterproofing. In this way, compatibility with mass production is improved, and adhesive dispensing is reduced.

EXPLANATION OF REFERENCE NUMERALS

201: Protective cover; 202: Fingerprint recognition sensor; 203: Circuit connector;
204: Reinforcement plate; 205: Wall plate; 206: Lower cover;
2051: Groove on an upper part of the wall plate; 2052: Notch inside the upper part of the wall plate;
2053: Side opening of the wall plate; 2011 and 2012: Bosses on a lower part of the protective cover;
207: Elastomer; 700: Electronic device; 701: Printed circuit board of the electronic device.

DESCRIPTION OF EMBODIMENTS

Specific implementations of the present invention are described in detail below with reference to the accompanying drawings.

Figure 1:
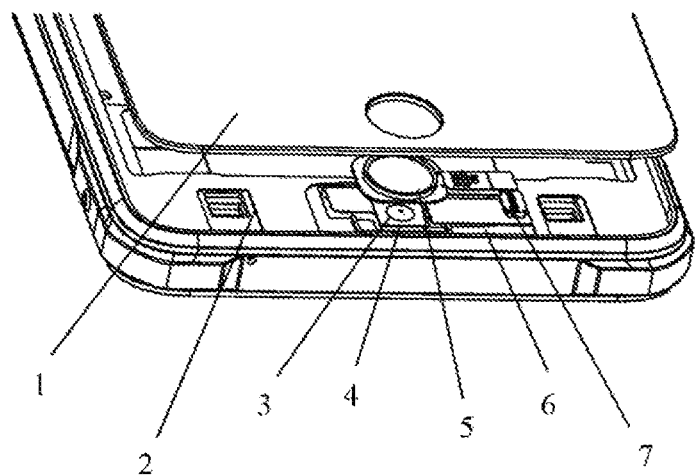
FIG. 1 is a structural diagram of waterproof encircling for a fingerprint recognition module in the prior art.
Figure 2A:
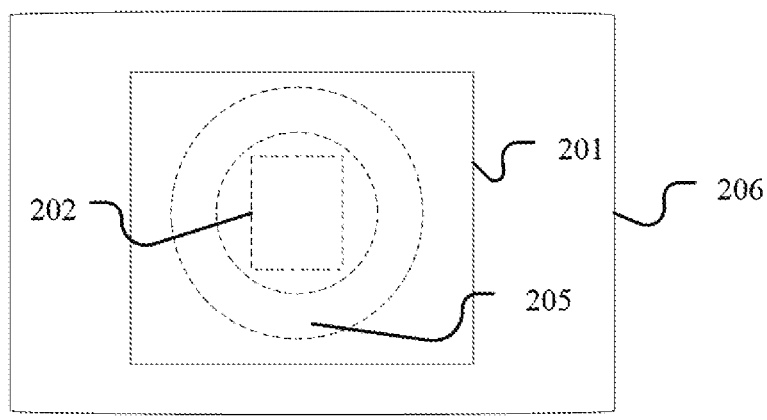
FIG. 2A is a top view of a fingerprint recognition module according to an embodiment of the present invention.
Figure 2B:
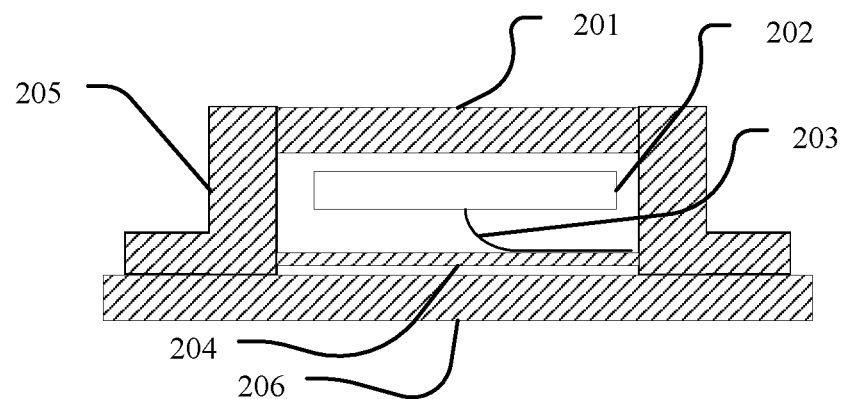
FIG. 2B is a side cross-sectional view of a fingerprint recognition module according to an embodiment of the present invention.
Figure 5:
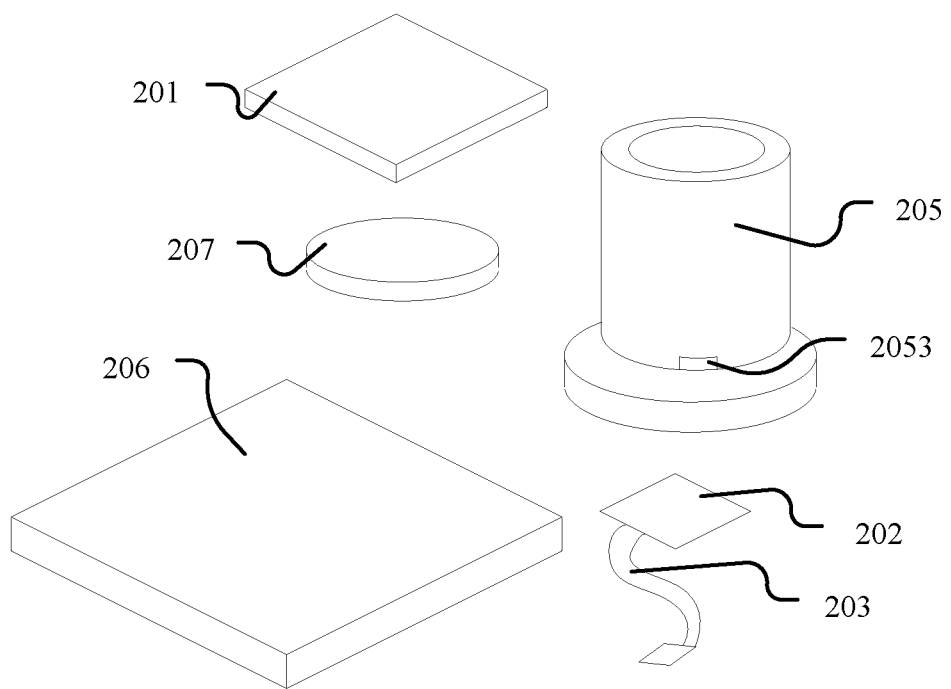
FIG. 5 is an exploded view of a fingerprint recognition module according to an embodiment of the present invention.

As shown in FIG. 2A, FIG. 2B, and FIG. 5, an embodiment of the present invention provides a waterproof fingerprint recognition module, including a protective cover 201, a fingerprint recognition sensor 202, a circuit connector 203, a wall plate 205, and a lower cover 206.

The protective cover 201 is commonly made of a high modulus material such as glass, sapphire, and ceramic and is mainly configured to protect the fingerprint recognition sensor 202, so that a foreign object such as sweat or a hard object is prevented from damaging the fingerprint recognition sensor.

The fingerprint recognition sensor 202 is configured to generate a fingerprint image after a finger touches the protective cover. A plurality of products may be available for selection of the fingerprint recognition sensor 202, for example, a 1268 fingerprint recognition chip from FPC or an 8268 chip from Goodix (Goddisk). This embodiment of the present invention imposes no limitation thereto.

The circuit connector 203 is configured to electrically connect a printed circuit board of an electronic device to the fingerprint recognition sensor. The circuit connector may be a wire, a flexible circuit board (Flexible Printed Circuit, FPC), or the like.

The wall plate 205 encircles the fingerprint recognition sensor 202 for one round to protect the fingerprint recognition sensor 202. The wall plate 205 may be made of a metal material.

The lower cover 206 is usually made of a metal material. Both the fingerprint recognition sensor 202 and the wall plate 205 are fastened on the lower cover 206 to form a whole.

The protective cover 201 is located over the wall plate 205, the wall plate 205 encircles the fingerprint recognition sensor 202, the protective cover 201 fully covers an upper opening of the wall plate 205, electronic waterproof adhesive is provided in a seam between the wall plate 205 and the protective cover 201, the lower cover 206 is located under the wall plate 205, and the lower cover 206 bonds with a lower part of the wall plate 205. If there is an opening on the lower part of the wall plate 205, the lower cover 206 fully covers the lower opening of the wall plate 205. Herein, "over" refers to a direction that a fingerprint sensing surface of the fingerprint recognition sensor 202 faces, and "under" refers to a direction opposite to the direction that the fingerprint sensing surface of the fingerprint recognition sensor 202 faces.

The upper opening of the wall plate 205 may be in the shape of a circle, a rectangle, an oval, a runway, or another closed figure. The wall plate 205 may be in the shape of a hollow cylinder, a cone, or the like.

Optionally, a reinforcement plate 204 is provided under the fingerprint recognition sensor 202, and the reinforcement plate 204 supports the circuit connector 203.

The lower cover 206 and the wall plate 205 are glued together by using electronic waterproof adhesive or are welded together.

Any one of the protective cover 201, the wall plate 205, the reinforcement plate 204, and the lower cover 206 may be molded integrally, or may be spliced by using at least two components. This embodiment of the present invention imposes no limitation thereto.

The electronic waterproof adhesive is also referred to as electronic damp-proof paint or conformal coating. The electronic waterproof adhesive is a coating made of a special formula, and is configured to protect a circuit board and a related device from erosion in an environment, to improve and prolong a service life of the circuit board and the related device, thereby ensuring use security and reliability. The electronic waterproof adhesive may be classified into the following types in terms of chemical composition:

Acrylic acid composition: Resistant to a high temperature of 130 degrees Celsius and a low temperature of minus 60 degrees Celsius, relatively hard after being cured, and has fine damp-proof, anti-corrosion, and salt spray resistance effects.

Polyurethane composition: Resistant to a high temperature of 130 degrees Celsius and a low temperature of minus 60 degrees Celsius, harder than acrylic acid after being cured, and has excellent weather resistance, damp-proof, anti-corrosion, and salt spray resistance effects.

Organosilicon composition: Organosilicon waterproof adhesive is a high-end product resistant to a high temperature of 200 degrees Celsius and a low temperature of minus 60 degrees Celsius, elastic after being cured, and has excellent damp-proof, anti-corrosion, and salt spray resistance effects.

There are mainly four methods for arranging the electronic waterproof adhesive:

1. Brush coating: is commonly used and can produce an excellent coating effect on a smooth surface.

2. Spray coating: A tank-type product can be conveniently applied in repair and small-scale production, and a spray gun is suitable for mass production. However, these two spray coating manners have a relatively high requirement for operation accuracy and may produce a shadow (a place that is on a lower part of an element and that is not covered by waterproof adhesive).

3. Dip coating: Dip coating can ensure full coating and does not cause a material waste that is caused due to excessive spray coating.

4. Selective coating: The coating is accurate without a material waste, is suitable for large-scale coating, but has a relatively high requirement for a coating device.

A type and an arranging method of the electronic waterproof adhesive are not limited in this embodiment of the present invention.

According to the waterproof fingerprint recognition module provided in the foregoing embodiment, the fingerprint recognition sensor is encircled by the protective cover, the wall plate, and the lower cover, and the electronic waterproof adhesive is provided in the seam, so that water is prevented from entering the fingerprint recognition sensor. In addition, the entire fingerprint module is integrated as a whole, so that waterproofing can be implemented by the fingerprint module, without a need to use a waterproofing design of another part of the electronic device to implement waterproofing.

As shown in FIG. 2B, the protective cover 201 may fit the upper opening of the wall plate. In other words, a size and a shape of the protective cover are approximately the same as a size and a shape of the upper opening of the wall plate. In this way, an area of the protective cover is relatively small.

Figure 3A:
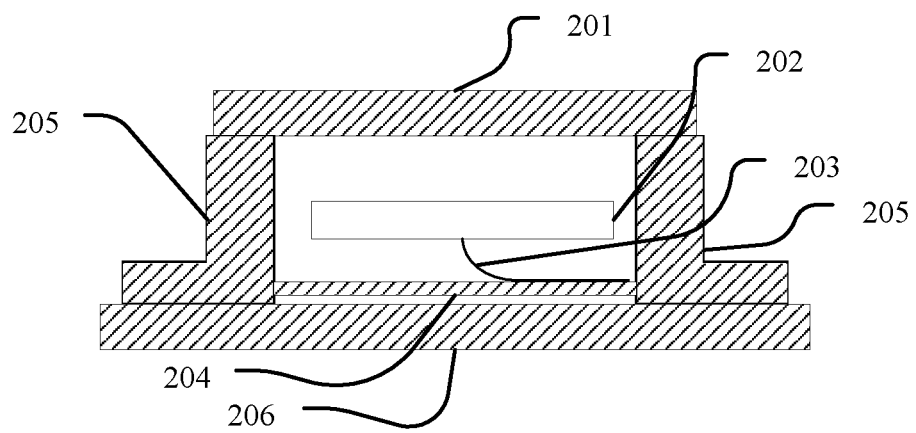
FIG. 3A is a side cross-sectional view of a fingerprint recognition module according to another embodiment of the present invention.
Figure 3B:
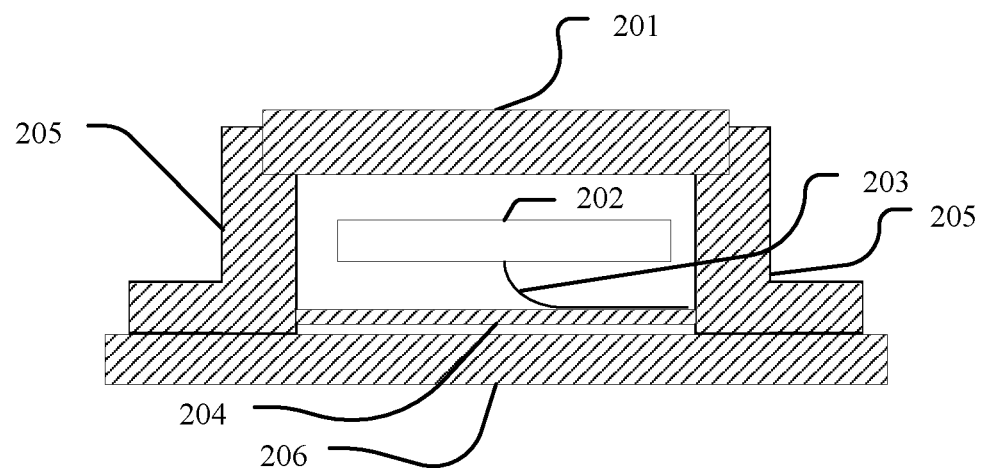
FIG. 3B is a side cross-sectional view of a fingerprint recognition module according to still another embodiment of the present invention.
Figure 3C:
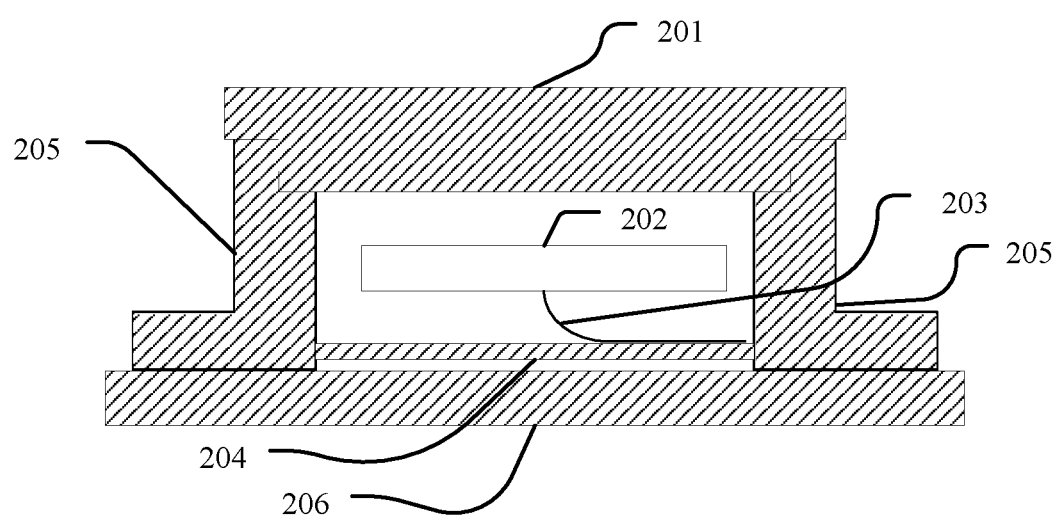
FIG. 3C is a side cross-sectional view of a fingerprint recognition module according to yet another embodiment of the present invention.
Figure 3D:
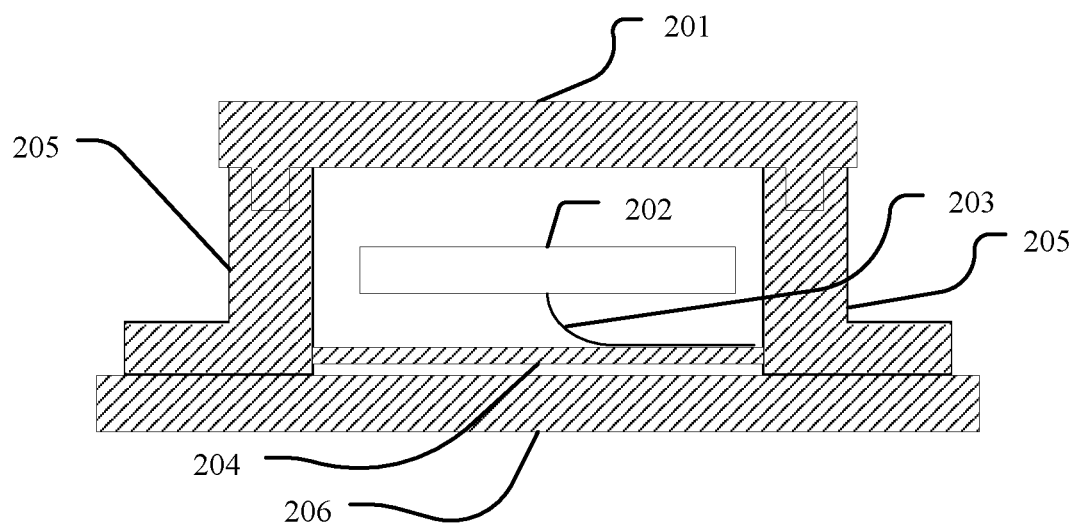
FIG. 3D is a side cross-sectional view of a fingerprint recognition module according to still yet embodiment of the present invention.
Figure 4A:
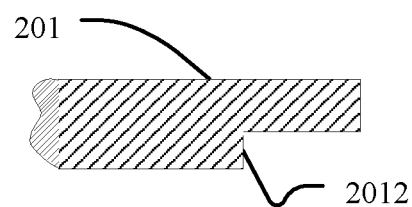
FIG. 4A is a partial side cross-sectional view of a boss of a protective cover and a notch of a wall plate in FIG. 3C.
Figure 4A:
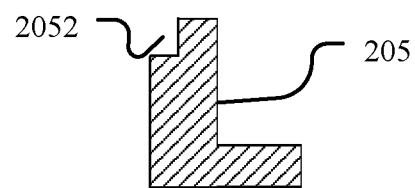
Figure 4B:
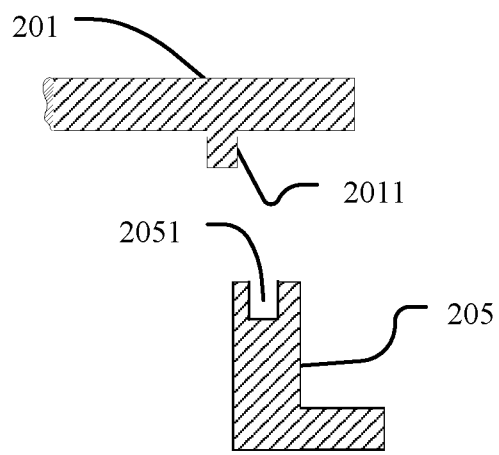
FIG. 4B is a partial side cross-sectional view of a boss of a protective cover and a groove of a wall plate in FIG. 3D.

Alternatively, as shown in FIG. 3A, the protective cover 201 may be greater than the upper opening of the wall plate 205. In this way, the protective cover fully covers the upper part of the wall plate, so that a water inflow path can be better cut off. Preferably, as shown in FIG. 3D and FIG. 4B, a groove 2051 is provided on an upper part of the wall plate 205, a boss 2011 is correspondingly provided on a lower part of the protective cover 201, and the boss fits the groove. Alternatively, as shown in FIG. 3B, FIG. 3C, and FIG. 4A, a notch 2052 is provided inside the upper opening of the wall plate 205, and a boss 2012 fitting the notch is provided on a lower part of the protective cover 201. The bottom of the groove 2051 and the bottom of the notch 2052 may be flat surfaces, or may be U-shape, V-shape, W-shape, or other curved surfaces. Correspondingly, the top of the boss 2011 may be a flat surface, or may be a U-shape, a V-shape, a W-shape, or another curved surface, and a fitting part between the boss 2012 and the notch 2052 may be a flat surface, or may be a U-shape, a V-shape, a W-shape, or another curved surface. This embodiment of the present invention imposes no limitation thereto. The groove, the notch, and the boss can better block a water inflow path and achieve a better waterproofing effect.

Figure 6A:
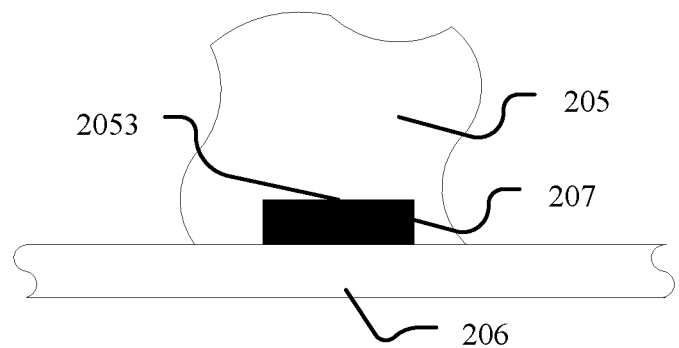
FIG. 6A is a partial elevational view of a side opening of a wall plate according to an embodiment of the present invention.
Figure 6B:
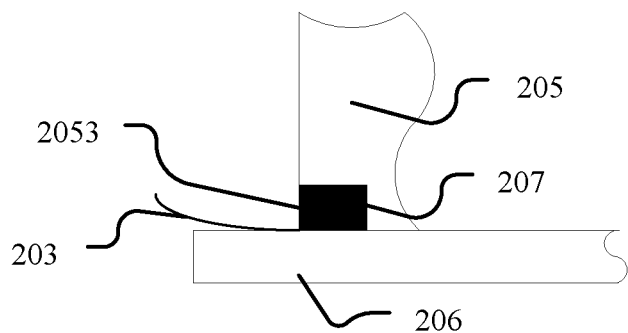
FIG. 6B is a partial side view of a side opening of a wall plate according to an embodiment of the present invention.

As shown in FIG. 5, in an embodiment of the present invention, a side opening 2053 is provided on a side face of the wall plate 205, the circuit connector 203 protrudes from the side opening 2053. The side opening 2053 is a possible water inlet, and therefore, waterproofing processing is required. In an embodiment, the side opening 2053 is stuffed with waterproof adhesive, so that a waterproofing purpose is achieved. As shown in FIG. 5, FIG. 6A, and FIG. 6B, in another embodiment, the side opening 2053 is blocked by an elastomer 207, and the elastomer 207 tightly fits (for example, through interference fitting) the side opening 2053, so that water seepage is prevented. The elastomer 207 may be made of an elastic material such as silica gel, rubber, a thermoplastic elastomer, modified polyurethane, and modified epoxy resin. The elastomer 207 may be a gasket, a washer, a cylinder fitting inside the wall plate 205, or a small piece of elastic material that fits the side opening 2053. This embodiment of the present invention imposes no limitation thereto.

Figure 7:
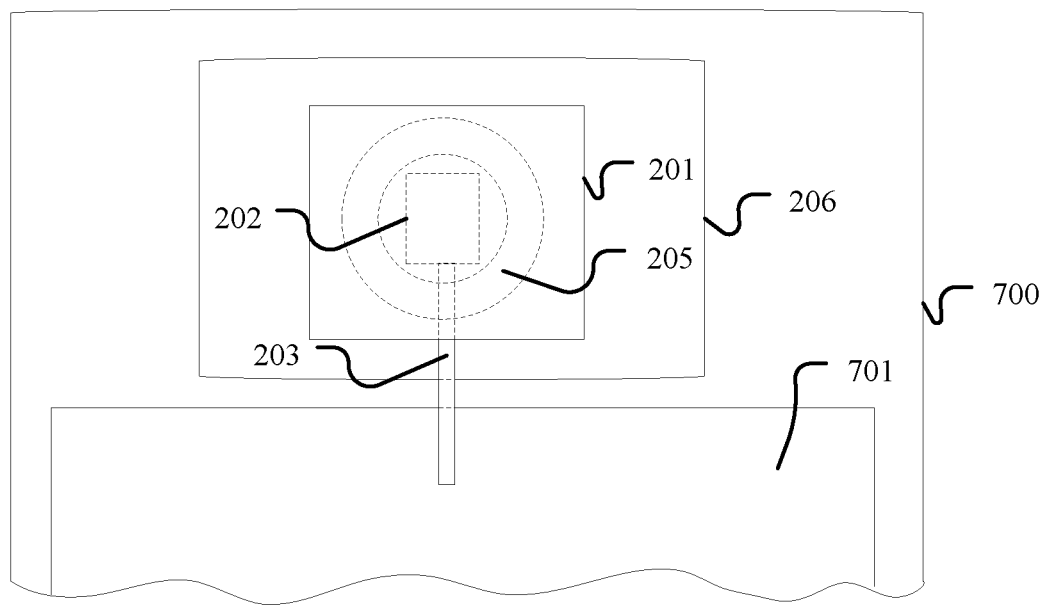
FIG. 7 is a schematic structural diagram of an electronic device according to an embodiment of the present invention.

As shown in FIG. 7, an embodiment of the present invention further provides an electronic device. The electronic device 700 includes the fingerprint recognition module disclosed in the foregoing embodiments and a printed circuit board (Printed Circuit Board, PCB) 701. A circuit connector 203 in the fingerprint recognition module is electrically connected to the PCB 701. A structure of the fingerprint recognition module has been described in detail in the foregoing embodiments. Details are not described herein again.

The electronic device may be a mobile phone, a tablet computer, a wearable device, a GPS receiver, an in-vehicle electronic device. This embodiment of the present invention imposes no limitation thereto.

In addition, the technology, the system, the apparatus, the method separately described in the foregoing embodiments and the technical features separately described in the foregoing embodiments may be combined, to form other modules, methods, apparatuses, systems, and technologies without departing from the spirit and principle of the present invention. These modules, methods, apparatuses, systems, and technologies that are obtained through combination according to records of the embodiments of the present invention fall within the protection scope of the present invention.

The foregoing embodiments are merely example embodiments of the present invention, but are not intended to limit the protection scope of the present invention. Any modification, equivalent replacement, or improvement made without departing from the spirit and principle of the present invention shall fall within the protection scope of the present invention.

What is claimed is:

1. A fingerprint recognition circuit, comprising:
    a fingerprint recognition sensor;
    a wall plate configured to encircle the fingerprint recognition sensor;
    a protective cover located on a top side of the wall plate and configured to fully cover an upper opening of the wall plate, wherein a waterproof adhesive is provided in a seam between the wall plate and the protective cover, and wherein the top side of the wall plate corresponds to a direction that a fingerprint sensing surface of the fingerprint recognition sensor faces;

a flexible circuit connector electrically coupled to the fingerprint recognition sensor;

a lower cover located on a bottom side of the wall plate and configured to bond with a lower part of the wall plate, wherein the bottom side of the wall plate corresponds to a direction opposite to the direction that the fingerprint sensing surface of the fingerprint recognition sensor faces; and a reinforcement plate configured to support the flexible circuit connector, wherein the reinforcement plate is between the fingerprint recognition sensor and the lower cover, wherein the reinforcement plate is parallel to both the protective cover and the lower cover, wherein the reinforcement plate is perpendicular to the wall plate, wherein the wall plate and the lower cover are made of metal, wherein the protective cover is coupled to the wall plate using the waterproof adhesive, wherein the wall plate is coupled to the lower cover using welding, wherein protective cover, the wall plate, and the lower cover form a waterproof chamber for the fingerprint recognition sensor, and wherein the waterproof chamber is configured to be physically attached to and communicatively coupled to an electronic device.

2. The fingerprint recognition circuit of claim 1, wherein a groove is provided on an upper part of the wall plate, and wherein a boss is provided on a lower part of the protective cover and configured to fit the groove.

3. The fingerprint recognition circuit of claim 2, wherein a side opening is provided on a side face of the wall plate, wherein the flexible circuit connector is configured to protrude from the side opening, and wherein the side opening is filled with the waterproof adhesive.

4. The fingerprint recognition circuit of claim 2, further comprising an elastomer, wherein a side opening is provided on a side face of the wall plate, wherein the flexible circuit connector is configured to protrude from the side opening, and wherein the elastomer is configured to securely fit the side opening.

5. The fingerprint recognition circuit of claim 1, wherein a notch is provided inside the upper opening of the wall plate, and wherein a boss is provided on a lower part of the protective cover and configured to fit the notch.

6. The fingerprint recognition circuit of claim 5, wherein a side opening is provided on a side face of the wall plate, wherein the flexible circuit connector is configured to protrude from the side opening, and wherein the side opening is filled with the waterproof adhesive.

7. The fingerprint recognition circuit of claim 5, further comprising an elastomer, wherein a side opening is provided on a side face of the wall plate, wherein the flexible circuit connector is configured to protrude from the side opening, and wherein the elastomer is configured to securely fit the side opening.

8. The fingerprint recognition circuit of claim 1, wherein a side opening is provided on a side face of the wall plate, wherein the flexible circuit connector is configured to protrude from the side opening, and wherein the side opening is filled with the waterproof adhesive.

9. The fingerprint recognition circuit of claim 1, further comprising an elastomer, wherein a side opening is provided on a side face of the wall plate, wherein the flexible circuit connector is configured to protrude from the side opening, and wherein the elastomer is configured to securely fit the side opening.

10. The fingerprint recognition circuit of claim 1, wherein the wall plate has an L-shaped cross-sectional area, and wherein the protective cover is made of glass.

11. An electronic device, comprising:

a printed circuit board; and a fingerprint recognition circuit coupled to the printed circuit board and comprising:

a fingerprint recognition sensor;

a wall plate configured to encircle the fingerprint recognition sensor;

a protective cover located on a top side of the wall plate and configured to fully cover an upper opening of the wall plate, wherein a waterproof adhesive is provided in a seam between the wall plate and the protective cover, and wherein the top side of the wall plate corresponds to a direction that a fingerprint sensing surface of the fingerprint recognition sensor faces;

a lower cover located on a bottom side of the wall plate and configured to bond with a lower part of the wall plate, wherein the bottom side of the wall plate corresponds to a direction opposite to the direction that the fingerprint sensing surface of the fingerprint recognition sensor faces;

a flexible circuit connector electrically coupled to the fingerprint recognition sensor and the printed circuit board; and a reinforcement plate configured to support the flexible circuit connector, wherein the reinforcement plate is between the fingerprint recognition sensor and the lower cover, wherein the reinforcement plate is parallel to both the protective cover and the lower cover, wherein the reinforcement plate is perpendicular to the wall plate, wherein the wall plate and the lower cover are made of metal, wherein the protective cover is coupled to the wall plate using the waterproof adhesive, wherein the wall plate is coupled to the lower cover using welding, wherein protective cover, the wall plate, and the lower cover form a waterproof chamber for the fingerprint recognition sensor, and wherein the waterproof chamber is configured to be physically attached to and communicatively coupled to the electronic device.

12. The electronic device of claim 11, wherein a groove is provided on an upper part of the wall plate, and wherein a boss is provided on a lower part of the protective cover and configured to fit the groove.

13. The electronic device of claim 12, wherein a side opening is provided on a side face of the wall plate, wherein the flexible circuit connector is configured to protrude from the side opening, and wherein the side opening is filled with the waterproof adhesive.

14. The electronic device of claim 12, further comprising an elastomer, wherein a side opening is provided on a side face of the wall plate, wherein the flexible circuit connector is configured to protrude from the side opening, and wherein the elastomer is configured to securely fit the side opening.

15. The electronic device of claim 11, wherein a notch is provided inside the upper opening of the wall plate, and wherein a boss is provided on a lower part of the protective cover and configured to fit the notch.

16. The electronic device of claim 15, wherein a side opening is provided on a side face of the wall plate, wherein the flexible circuit connector is configured to protrude from the side opening, and wherein the side opening is filled with the waterproof adhesive.

17. The electronic device of claim 15, further comprising an elastomer, wherein a side opening is provided on a side face of the wall plate, wherein the flexible circuit connector is configured to protrude from the side opening, and wherein the elastomer is configured to securely fit the side opening.

18. The electronic device of claim 11, wherein a side opening is provided on a side face of the wall plate, wherein the flexible circuit connector is configured to protrude from the side opening, and wherein the side opening is filled with the waterproof adhesive.

19. The electronic device of claim 11, further comprising an elastomer, wherein a side opening is provided on a side face of the wall plate, wherein the flexible circuit connector is configured to protrude from the side opening, and wherein the elastomer is configured to securely fit the side opening.

\* \* \* \* \*